United States Patent [19]
Agoyan et al.

[11] Patent Number: 6,166,330
[45] Date of Patent: Dec. 26, 2000

[54] HOUSING FOR AN EXTENDED-FORMAT RELEASABLE PLUG-IN CARD

[75] Inventors: Michel Agoyan, Marseilles; Michel Chomette, Ventabren, both of France

[73] Assignee: Gemplus S.C.A., Gemenos, France

[21] Appl. No.: 09/077,696

[22] PCT Filed: Nov. 25, 1996

[86] PCT No.: PCT/FR96/01859

§ 371 Date: Jun. 25, 1998

§ 102(e) Date: Jun. 25, 1998

[87] PCT Pub. No.: WO97/19422

PCT Pub. Date: May 29, 1997

[30] Foreign Application Priority Data

Nov. 23, 1995 [FR] France .................................. 95 13965

[51] Int. Cl.[7] .................................................. H01R 13/508
[52] U.S. Cl. .......................................................... 174/59
[58] Field of Search ..................................... 174/59, 60

[56] References Cited

U.S. PATENT DOCUMENTS

| | | | |
|---|---|---|---|
| 5,852,257 | 12/1998 | Dittman et al. | 174/59 |
| 5,892,653 | 4/1999 | Nishimuta et al. | 174/59 X |
| 5,920,034 | 7/1999 | Saka et al. | 174/59 |
| 5,939,673 | 8/1999 | Rentmore | 174/59 |

FOREIGN PATENT DOCUMENTS

| | | |
|---|---|---|
| 0602778 | of 1994 | European Pat. Off. . |
| 0661617 | of 1995 | European Pat. Off. . |

*Primary Examiner*—Dean A. Reichard
*Attorney, Agent, or Firm*—Roland Plottel

[57] ABSTRACT

A unitary housing for an extended-format releasable plug-in card (15). The housing comprises a first block (12) adapted to the standard plug-in card format and designed to contain the standardized portion of the card (15) inserted into the slot of a microcomputer, as well as a second block (16). The housing is characterized in that the second block (16) can receive at least the extension ($Z_2$) of the card (15), and includes flanges (18) positionable between the side edges of the card (15) and those of the first block (12). The flanges (18) enable the first and second blocks (12, 16) to be rigidly connected so that they are inseparable and the whole housing thereafter forms a single block. Said housing is useful for mechanically protecting extended-format PCMCIA electronics.

11 Claims, 4 Drawing Sheets

HOUSING FOR AN EXTENDED-FORMAT RELEASABLE PLUG-IN CARD

The invention relates to a housing for an extended, detachable plug-in card intended to be partially inserted, on a temporary basis, in a personal computer (PC).

Detachable plug-in cards are generally known as PCMCIA cards and are achieved on printed circuit cards in accordance with the PCMCIA standard defined by the association with the same name ("Personal Computer Memory Card Association", 1030 B East Duane Avenue, Sunnyvale, Calif.). They include several integrated circuit chips and a 68-pin female connector which can be plugged into a corresponding male connector of the PC. These cards are mainly mass storage cards which may replace diskettes and other mass storage means of magnetic type in the future. They have equivalent storage capacities and much faster access times than magnetic memories. They can also be used as RAM extensions for the PC.

Typically, the standard dimensions of the housings, which make it possible to protect these PCMCIA cards against any possible physical shocks and external aggressions, are of approximately 5.4 cm by 8.5 cm and their thickness is of approximately 3 to 5 mm.

The PCMCIA standard provides for memory extensions in order to increase the storage capacities of these cards. This creates a large number of problems in terms of practical achievement. Indeed, it is necessary to provide a new housing in which to accommodate the card equipped with its extension, while observing certain recommendations submitted by the PCMCIA association concerning dimensions. The standard part of the extended PCMCIA card is always intended to be inserted in the slot of a PC, whereas the extended part, which is connected to the standard part, is intended to remain outside of the PC.

The PCMCIA association has provided a few recommendations regarding the dimensions of the housing capable of containing the extended part. The recommendations are by no means definite and may still evolve. For this reason, there is currently no housing marketed with the required dimensions.

Nevertheless, a solution has been considered. This solution consists of achieving two independent housings and connecting them. The first housing, which exists, contains the standard part of a PCMCIA card. The second housing, which will be achieved as per the dimensions of the extension, contains the latter. It is then necessary to add a male (or female) connector to the existing housing, and the complementary connector to the second housing. These two additional connectors will thus make it possible to ensure both an electrical link and a mechanical link between the standard part of the card and its extension.

However, it is immediately clear that this solution has many disadvantages. Indeed, the achievement of a second connector which can be plugged into a standard PCMCIA card leads to a loss of approximately 20 mm of surface out of a total surface of 85 mm, which amounts to a loss of available surface of approximately 25%. This loss of available surface is considerable insofar as the problem to be solved consists of extending the storage area, i.e. maximising the available surface on one or more printed circuit cards.

Furthermore, the act of plugging two housings together in order to connect the standard part of a PCMCIA card to its extension does not make it possible to obtain a reliable mechanical link. Indeed, given the fact that the extension is located outside of the PC, a mere shock against its housing may produce a deterioration, or even a break of the link between the two additional connectors, i.e. a deterioration of the electrical and mechanical links created between the standard part and the extension. As a result, two independent housings connected together so as to achieve an extended detachable plug-in card form a fragile device with a very low resistance to mechanical shocks. Finally, the manufacturing cost of these housings is too high to enable their large-scale distribution.

No satisfactory solution to manufacture a housing for an extended detachable card has yet been proposed up to now.

The present invention makes it possible to eliminate all of the above-mentioned disadvantages, as it proposes a housing comprising two blocks rigidly attached to one another so that they form a single block. These two blocks ensure a sturdy mechanical link between the standard part of a PCMCIA card and its extension.

The invention more specifically concerns a housing for an extended detachable plug-in card, comprising a first block achieved as per the standard size for plug-in cards and intended to contain the standard part of the card inserted in the slot of a PC, and a second block. This housing is characterised in that the second block is capable of receiving at least the extension of the card and comprises couplings intended to be placed between the side edges of the card and those of the first block, so as to rigidly attach said first and second blocks.

The housing according to the invention is achieved in such a manner that, once assembled, it appears in the form of a single block. It is intended to contain a single printed circuit card which supports both the standard part and the extension. With this housing, printed circuit surface available is maximised, as there is no additional fastening element, such as a plug-in connector, capable of causing a loss of surface. The couplings ensure a good mechanical rigidity for the entire housing. Furthermore, the manufacturing cost is significantly reduced, as it is no longer necessary to provide additional fastening elements.

Further characteristics and advantages of the invention will be more clearly understood upon reading the description which follows, provided on an illustrative and non-limiting basis and made with reference to the attached drawings, in which.

Figure 1:
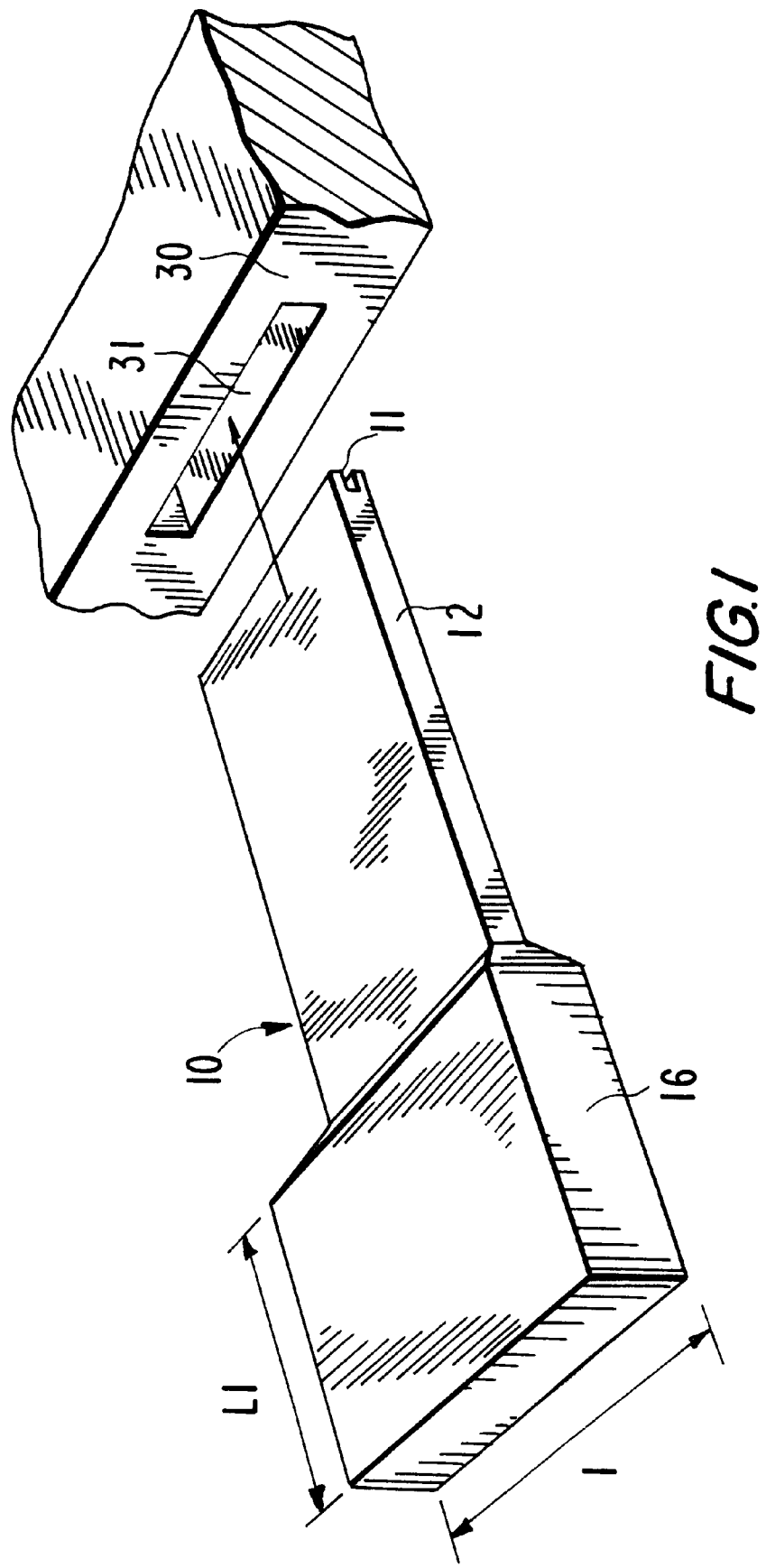
FIG. 1 is a general perspective view of a housing for an extended plug-in card.

The housing according to the invention, for an extended detachable card with a plug-in connector, is indicated by reference number 10. This housing comprises two blocks: a first block 12 is achieved as per the standard size for plug-in cards and is intended to contain the standard part of a PCMCIA card, which is inserted in the slot 31 of a PC 30; a second block 16 is provided to contain a memory extension of the PCMCIA card. The extended part of the card is intended to remain outside of the slot 31 of the PC. In theory, the standard part contained in the first block 12 comprises a 68-pin external female connector 11 which can penetrate the root of the slot 31, the latter being equipped with a corresponding 68-pin male connector. This male connector makes up a parallel input-output port for the PC and the communication between the detachable plug-in card and the PC is a parallel type communication.

The PCMCIA card comprises one or more integrated circuit chips and connections are achieved between this/these chip(s) and the various pins of the external plug-in connector 11. But the card may have other functions and comprise, for example, a microprocessor, etc.

Typically, the dimensions of the first standard block 12, according to the PCMCIA standard, are of approximately 5.4 cm by 8.5 cm, with a thickness of approximately 3 to 5 mm.

The housing 10 containing the detachable plug-in card is shown outside of the slot 31 of the PC 30. The block 12 is inserted in the slot 31 along the direction indicated by the arrow shown in FIG. 1.

As far as the dimensions of the block 16 provided for the extension of the card are concerned, the PCMCIA association has issued a few recommendations, but nothing has been clearly decided to date. As a result, the housing according to the invention has been achieved with dimensions which may be adapted to future standards possibly falling within the scope of these recommendations.

The length $L_1$ of the block 16 is defined as being parallel to the longitudinal sides of the standard block 12, and its width l is defined as being parallel to the small sides of the standard block 12.

Figure 2:
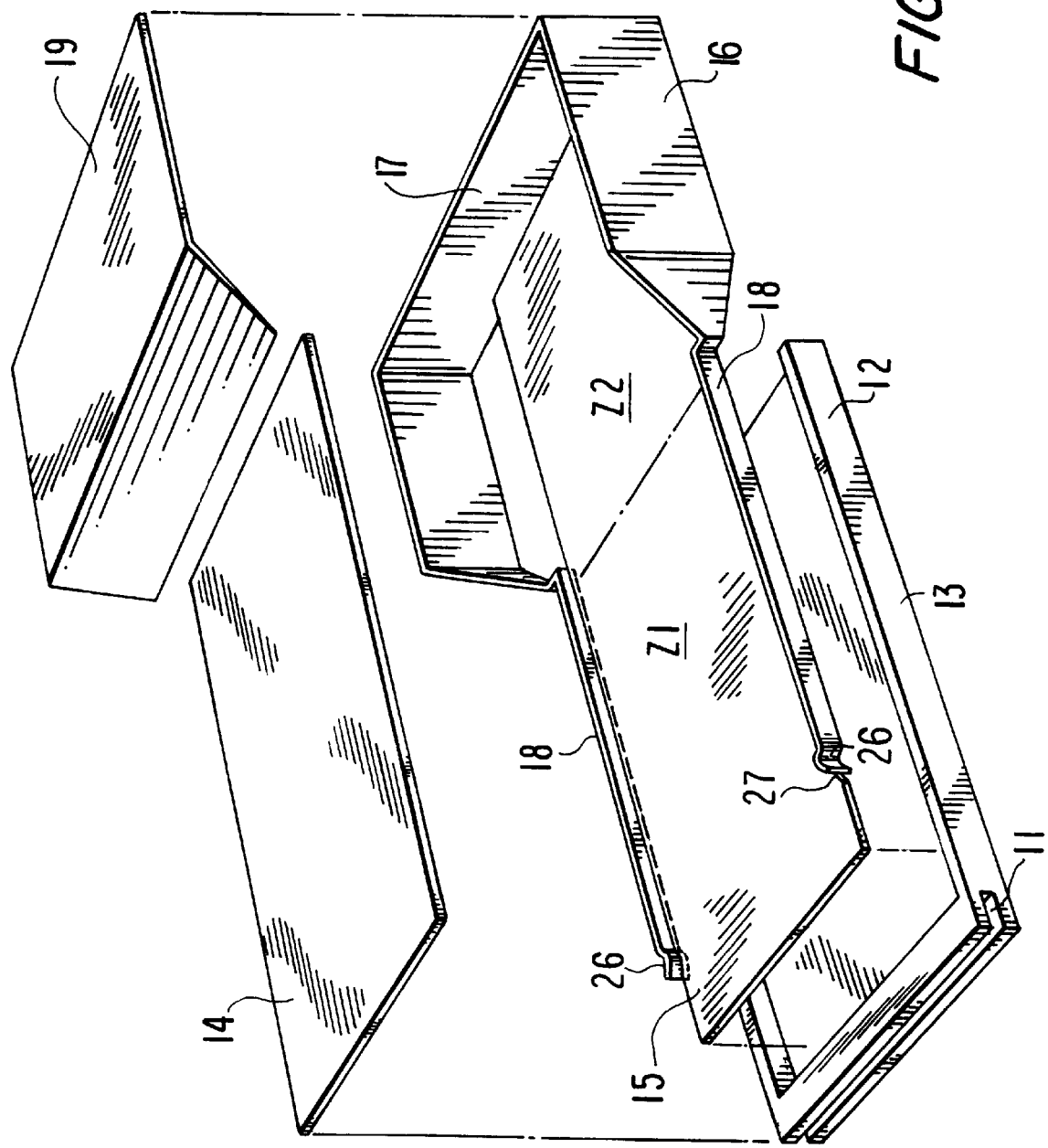
FIG. 2 is a diagram of an embodiment of a housing according to the invention.

Details of the housing of FIG. 1 will be more clearly understood upon examining FIG. 2. Indeed, in this figure the housing is shown in exploded form.

In an advantageous manner, the standard part and the extended part of the PCMCIA card are achieved on the same printed circuit card 15. This card comprises two regions: the first region $Z_1$ corresponds to the standard part of the card and the second region $Z_2$ corresponds to the extended part. The first region $Z_1$ is of the printed circuit card 15 is therefore intended to be placed in the first block 12 of the housing, whereas the other region $Z_2$ is intended to be placed in the second block 16.

The first block 12 consists of a rear surface 13 and a front surface 14 whose assembly is preferably performed by means of clips. These clips are for example lugs, provided on the lower face of the front surface 14, which interlock with recesses provided on the upper face of the rear surface 13. These clips are not visible in FIG. 2. There are for example four of them: two on each side, along the longitudinal edges of the block 12; but there can be more or less of them. When the rear 13 and front 14 surfaces are assembled, the maximum width of the printed circuit card 15, inside the block 12, is approximately equal to 53.5 mm.

In an advantageous manner, couplings 18 are provided in the prolongation of the second block 16. These couplings 18 are intended to be placed between the side edges of the card 15 and those of the first block 12. They thus make it possible to rigidly attach the two blocks 12 and 16, in such a manner that they become inseparable and that the housing, taken as a whole, forms a single block. Furthermore, the couplings 18 ensure a good mechanical rigidity for the entire housing.

Preferably, each coupling 18 comprises, at its end for example, a lug 26 capable of interlocking with a recess 27 provided in the printed circuit card 15. The lugs 26 thus make it possible to lock the second block 16 in the standard block 12, and to avoid the slightest possible backward movement of the second block 16 with respect to the printed circuit card 15. In an optional embodiment, it is absolutely possible to provide these lugs somewhere on the couplings, in the middle for example.

The frame 17 of the second block 16 is for example achieved using a stainless steel sheet. This sheet has the advantage of being flexible and easy to work, thus simplifying its shaping. Due to this flexibility, the couplings 18 tend to separate from or come closer to one another when they are not retained. In the housing according to the invention, the lateral retention of the couplings is therefore ensured, on the one hand, by means of the card 15 and, on the other hand, by means of the side edges of the standard block 12.

The front surface 19 of the second block 16 is preferably achieved using a plastic material.

In FIG. 2, the second block 16 is wider than the standard block 12. This width is not fixed, and may vary from one housing to another.

The two blocks 12 and 16 making it possible to achieve the housing for an extended PCMCIA card according to the invention are assembled without additional fastening elements, in a specific order. Once assembled, these blocks cannot be easily separated. The assembly of the blocks of the housing first consists of separating the rear surface 13 from the front surface 14 of the standard block 12. The couplings 18 of the second block 16 are then placed along the longitudinal edges of the printed circuit card 15 so that the lugs 26 interlock with the recesses 27. Then, the assembly consisting of the block 16 secured to the card 15 by means of the couplings 18 is engaged in the standard block 12. The last step of the assembly consists of securing the front surface 14 of the standard block 12 to the rear surface 13, and the front surface 19 of the second block 16, intended for the extension, to the frame 17.

Figure 3:
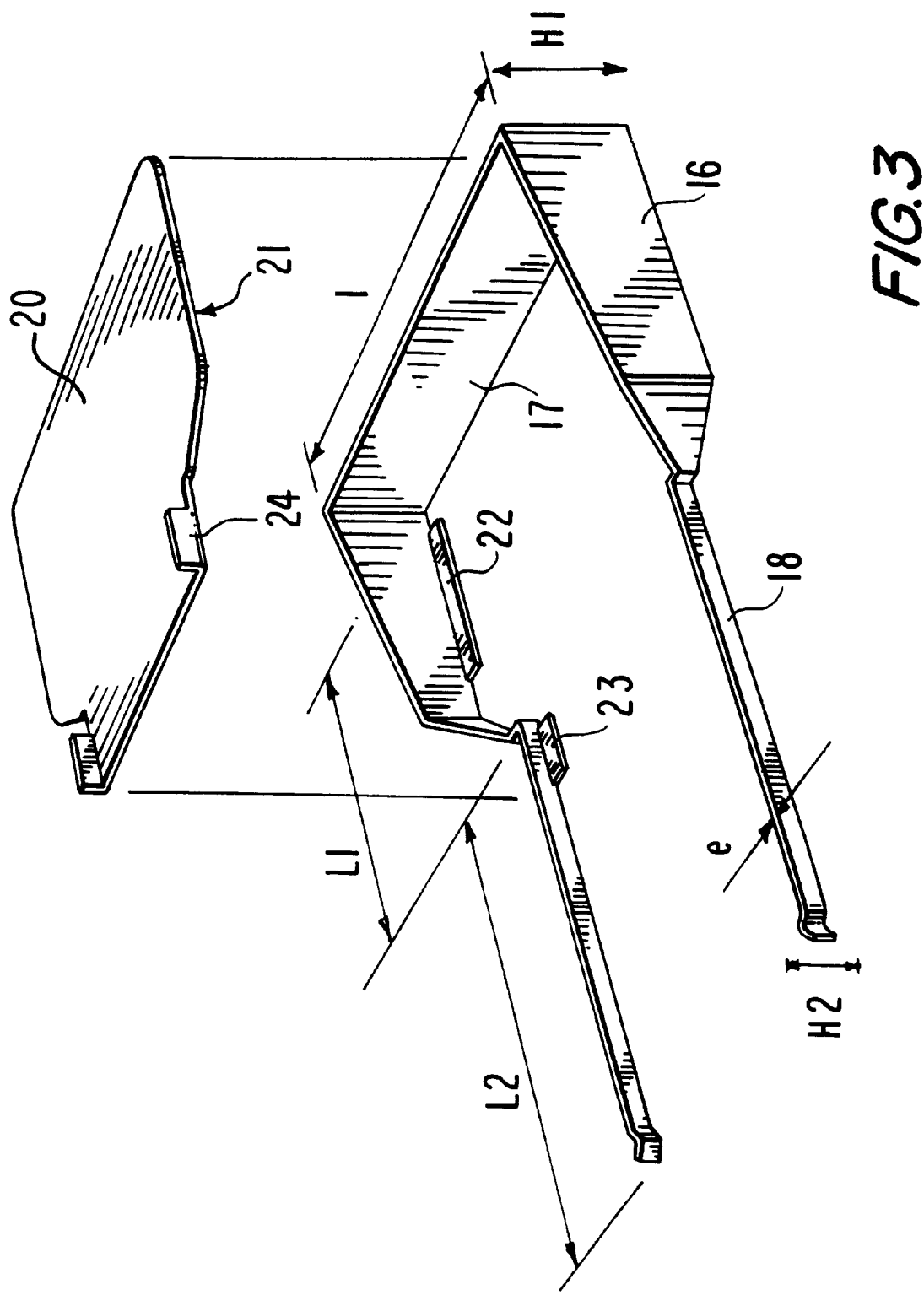
FIG. 3 is an exploded view of an element of a housing according to the invention.

FIG. 3 shows an exploded view of the second block 16 of the housing according to the invention, i.e. a view of the block intended to contain the second region $Z_2$ of the card 15 forming the extension of the PCMCIA card. The frame 17 of this block 16 preferably has a cubical shape as shown in FIG. 2. However, according to one embodiment, it may have a different shape. Thus, in FIG. 3, the longitudinal edges of the block do not have the same height at each of their ends and thus have generally quadrilateral shapes.

Furthermore, it is advantageous to achieve such a block 16 so that it has a height sufficiently great to enable it to contain one or more additional printed circuit cards. Thus, the additional card(s) is/are stacked connected (together and) with the extended card 15. The connection between the cards is performed by means of conducting wires for example. This stacking of the cards thus makes it possible to further increase, in a significant manner, the available printed circuit surface, i.e. the memory area and the storage capacity.

The bottom 20 of the block 16 is assembled with the frame 17 by welding for example. It is placed in such a manner that its inner face 21 rests against tabs 22 and 23 provided on the lower part of the frame 17. The bottom 20 is then welded, or bonded for example, onto the tabs 22 and 23.

Preferably, additional small tabs 24 are provided on the bottom 20, at both sides of its front end intended to be accommodated between the two couplings 18 of the block 16. These tabs 24 are also welded, or bonded, onto the couplings 18. They provide additional reinforcement and contribute to the lateral retention of the couplings 18 and to obtaining a good mechanical rigidity for the entire housing according to the invention. The front surface of the block 16 is not shown in FIG. 3 but, as previously mentioned, it is preferably achieved using a plastic material.

The dimensions of the block 16 intended to receive the region $Z_2$ of the printed circuit card 15, i.e. the memory extension region, are provided herein as an example. The invention is by no means limited to these dimensions. Indeed, they are fully adaptable to future standards possibly defined by the PCMCIA association.

The second block 16 can thus have a height $H_1$, comprised between 10 and 25 mm, a width l comprised between 54 and 70 mm, and a length $L_1$ comprised between 40 and 50 mm.

The couplings 18 preferably have a length $L_2$ comprised between 50 and 60 mm so as to properly enter the standard block 12, a height $H_2$ comprised between 2 and 3 mm, and a thickness e comprised between 0.1 and 0.7 mm. The couplings 18 are separated from one another by a value comprised between 53.7 mm and 52.5 mm.

With the housing according to the invention, the available surface on the printed circuit card 15 is maximised. Indeed, the width of the card is only decreased by the value of the thickness of the couplings and the total length $(L_1+L_2)$ is fully available since there is/are no additional element(s), such as plug-in connectors, capable of causing a loss of surface. In addition, since the second block 16 of the housing is manufactured using an inexpensive stainless steel sheet, which folds easily to create various shapes, and the standard block 12 is not modified, the manufacturing cost of the housing according to the invention is relatively low and adapted to large-scale distribution. Finally, the housing has a good mechanical rigidity, since the two blocks are assembled in such a manner that they become inseparable.

Figure 4:
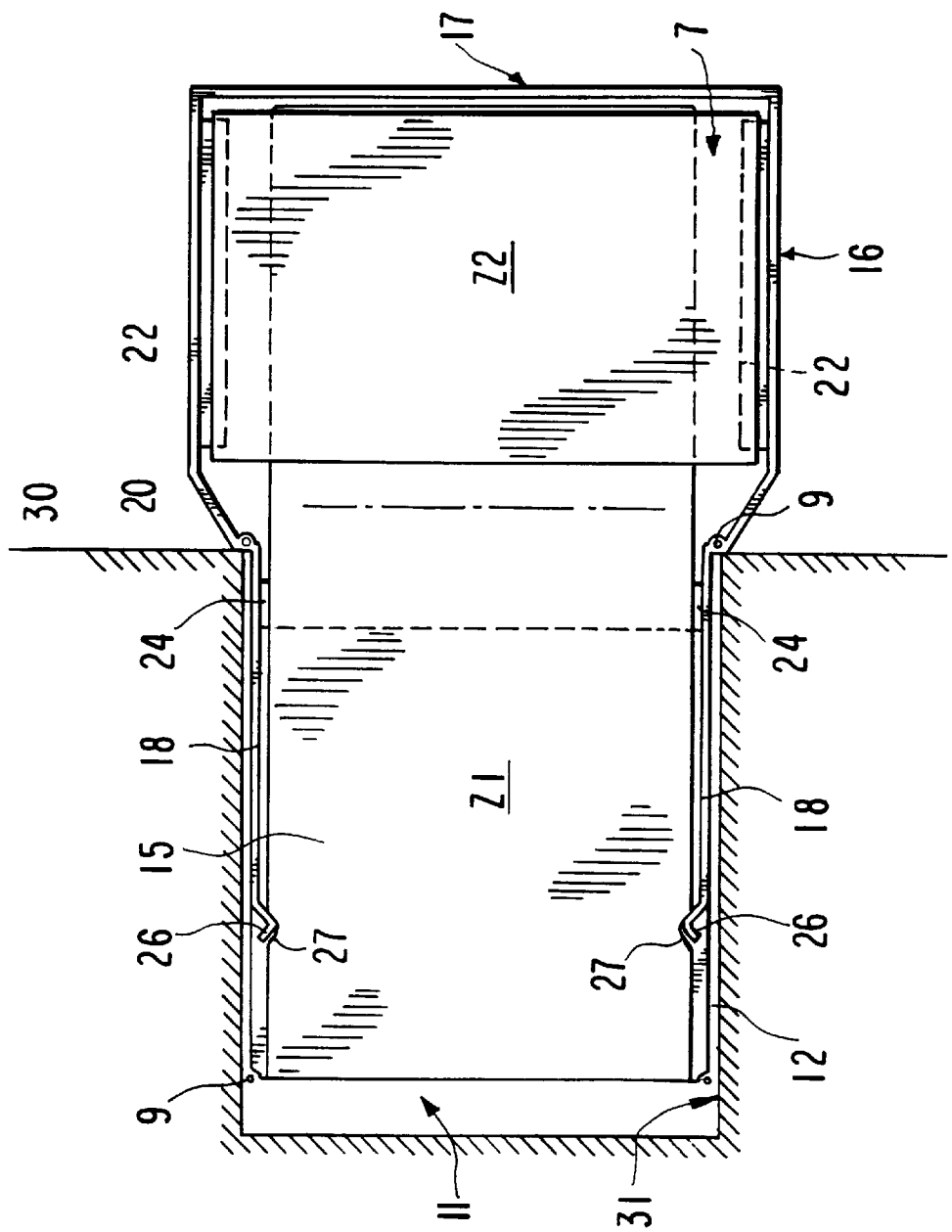
FIG. 4 is a top view of a housing according to the invention partially inserted in the slot of a PC.

FIG. 4 shows a top view of a housing according to the invention, partially inserted in the slot 31 of a PC 30. The front surfaces 14 and 19 of the blocks 12 and 16 are not shown in this figure. In addition, the parts common to the previous figures are indicated by the same reference numbers and shall not be described.

The clips making it possible to close the housing are illustrated with small circles and indicated by reference number 9. The tabs 24 belonging to the bottom 20, of the block 16 intended for the extended part, are preferably welded or bonded onto the couplings 18. They thus make it possible to contribute to the lateral retention of the couplings and to obtaining a good mechanical rigidity for the entire housing.

An optional embodiment consisting of stacking an additional printed circuit card 7 on the card 15 is shown in FIG. 4. The additional card 7 is connected to the card 15 by means of conducting wires for example, passing through holes provided in the additional card 7 and not shown in FIG. 4.

What is claimed is:

1. An extended plug in card, having a first block (12) adapted to fit into and make electrical connections in a slot (31) of a computer (30), and a second extended sized block (16), said card containing a printed circuit card (15) with a first region (z1) mechanically fixed in said first block, and a second region (z2) in said second block; a coupling (18) extending from said second block into said first block and mechanically fixed by mating with said printed circuit card (15), whereby said first and second blocks are joined together with the printed circuit card therein.

2. The card according to claim 1, characterized in that the second block (16) is achieved using a stainless steel sheet.

3. The card according to claim 1, characterized in that the block (16) has a height ($H_1$) sufficiently great to enable it to contain one or more additional printed circuit cards, stacked on top of one another and connected together.

4. The card according to claim 1, characterized in that the second block (16) has a height ($H_1$) comprised between 10 and 25 mm, a width (1) comprised between 54 and 70 mm, and a length ($L_1$) comprised between 40 and 50 mm.

5. The card according to claim 1, wherein said coupling comprises a pair, with one on each lateral side of the printed circuit card (15).

6. The card according to one of claims 1, 5, or 2, characterized in that the coupling of couplings (18) each have a length ($L_2$) comprised between 50 and 60 mm, a height ($H_2$) comprised between 2 and 3 mm, and a thickness (e) comprised between 0.1 and 0.7 mm, and in that they are separated from one another by a value comprised between 53.7 mm and 52.5 mm.

7. The card according to claim 5, characterized in that each coupling (18) comprises a lug (26) capable of interlocking with a corresponding recess (27) provided in the printed circuit card (15).

8. A housing for an extended plug-in card comprising a first block (12) of a size adapted to fit with a computer slot, and having a front plate (14) and a rear plate (13), said rear plate having a hollow central portion a second extended part block (16) adapted to extend outside the computer slot when the first block is therein, and having a hollow frame (17) with a front plate (19), a bottom plate (20), three side walls on three sides, and couplings (18) extending parallel outwardly from two opposite side walls, and mountable inside said hollow portion of said first block when said blocks are assembled said blocks adapted to receive at least one printed circuit board (15) to be mounted in said hollow portion of said first block and with a coupling engaging said board, whereby when assembled said coupling holds said two blocks together.

9. The housing according to claim 8, characterized in that the coupling comprises a lug capable of interlocking with a corresponding recess provided in the at least one printed circuit board.

10. The housing according to claim 8, further comprising tabs (23, 24) protruding inwardly from said coupling (18) and said bottom plate (20).

11. The housing according to claim 10, wherein said tabs (24) on said bottom plate are welded to said supports.

* * * * *